(12) United States Patent
Kita

(10) Patent No.: US 7,706,072 B2
(45) Date of Patent: Apr. 27, 2010

(54) OPTICAL INTEGRATOR, ILLUMINATION OPTICAL DEVICE, PHOTOLITHOGRAPH, PHOTOLITHOGRAPHY, AND METHOD FOR FABRICATING DEVICE

(75) Inventor: Naonori Kita, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/793,448

(22) PCT Filed: Dec. 9, 2005

(86) PCT No.: PCT/JP2005/022612

§ 371 (c)(1),
(2), (4) Date: Jun. 20, 2007

(87) PCT Pub. No.: WO2006/070580

PCT Pub. Date: Jul. 6, 2006

(65) Prior Publication Data

US 2008/0074631 A1     Mar. 27, 2008

(30) Foreign Application Priority Data

Dec. 27, 2004   (JP)   ............................. 2004-375854

(51) Int. Cl.
*G02B 27/10* (2006.01)

(52) U.S. Cl. ................. 359/624; 359/619; 359/621; 355/67

(58) Field of Classification Search ............. 355/53, 355/67, 71; 359/614, 621, 622, 619, 620, 359/624

See application file for complete search history.

(56) References Cited

U.S. PATENT DOCUMENTS

| | | | | |
|---|---|---|---|---|
| 4,682,885 A * | 7/1987 | Torigoe | ................. | 355/67 |
| 4,733,944 A | 3/1988 | Fahlen et al. | | |
| 5,237,367 A * | 8/1993 | Kudo | ................. | 355/67 |
| 5,592,332 A * | 1/1997 | Nishio et al. | ................. | 359/619 |
| 5,621,499 A * | 4/1997 | Shiozawa | ................. | 355/67 |
| 6,639,652 B1 * | 10/2003 | Mori et al. | ................. | 355/67 |
| 6,738,129 B2 * | 5/2004 | Mizouchi | ................. | 355/67 |
| 7,236,239 B2 * | 6/2007 | Hase | ................. | 356/124 |
| 2001/0033422 A1 * | 10/2001 | Miura et al. | ................. | 359/621 |

(Continued)

FOREIGN PATENT DOCUMENTS

DE    3838168 A1 *  5/1989

(Continued)

*Primary Examiner*—Hung Henry Nguyen
*Assistant Examiner*—Steven H Whitesell-Gordon
(74) *Attorney, Agent, or Firm*—Oliff & Berridge, PLC (57) ABSTRACT

An optical integrator has characteristics to suppress influence of relative positioning error of a pair of optical members on an illuminance distribution and on a shape of an illumination field. The optical integrator is a wavefront splitting type optical integrator having a first optical member and a second optical member in order from the entrance side of light. The first optical member has first entrance surfaces having a refractive power in a first direction and substantially no refractive power in a second direction, and first exit surfaces having a refractive power in the first direction and substantially no refractive power in the second direction. The second optical member has second entrance surfaces having a refractive power in the second direction and substantially no refractive power in the first direction, and second exit surfaces having a refractive power in the second direction and substantially no refractive power in the first direction.

38 Claims, 7 Drawing Sheets

U.S. PATENT DOCUMENTS

| | | | |
|---|---|---|---|
| 2004/0218164 A1* | 11/2004 | Kohno | 355/67 |
| 2006/0050259 A1* | 3/2006 | Shinoda | 355/67 |
| 2006/0055834 A1 | 3/2006 | Tanitsu et al. | |
| 2008/0007706 A1* | 1/2008 | Reisinger et al. | 355/67 |

FOREIGN PATENT DOCUMENTS

| | | |
|---|---|---|
| JP | A 5-134230 | 5/1993 |
| JP | A 7-174974 | 7/1995 |
| JP | A 2004-198748 | 7/2004 |
| WO | WO 95/00865 | 1/1995 |
| WO | WO 2004/051717 A1 | 6/2004 |

\* cited by examiner

OPTICAL INTEGRATOR, ILLUMINATION OPTICAL DEVICE, PHOTOLITHOGRAPH, PHOTOLITHOGRAPHY, AND METHOD FOR FABRICATING DEVICE

CROSS-REFERENCE TO RELATED APPLICATIONS

This application is based upon and claims the benefit of priorities from International Application No. PCT/JP2005/022612 filed on Dec. 9, 2005, and Japanese Patent Application No. 2004-375854 filed on Dec. 27, 2004, the entire contents of which are incorporated herein by reference.

BACKGROUND

1. Field

One embodiment of the present invention relates to an optical integrator, illumination optical apparatus, exposure apparatus, and exposure method and, more particularly, to an optical integrator suitably applicable to an illumination optical apparatus in exposure apparatus for manufacturing micro devices, such as semiconductor devices, image pickup devices, liquid-crystal display devices, and thin-film magnetic heads, for example, by lithography.

2. Description of the Related Art

In the typical exposure apparatus of this type, a light beam emitted from a light source is guided through a fly's eye lens to form a secondary light source consisting of a large number of light sources on the rear focal plane of the fly's eye lens. Light beams from the secondary light source are guided through an aperture stop disposed in the vicinity of the rear focal plane of the fly's eye lens, to be limited thereby, and then enter a condenser lens. The aperture stop limits the shape and size of the secondary light source to a desired shape and size, according to a desired illumination condition (exposure condition).

The light beams condensed by the condenser lens illuminate a mask with a predetermined pattern therein, in a superposed manner. Light transmitted by the pattern of the mask travels through a projection optical system to be focused on a wafer. In this manner the mask pattern is projected (or transferred) onto the wafer to effect exposure thereof. The pattern formed in the mask is of high integration and a uniform illuminance distribution must be formed on the wafer in order to accurately transfer the microscopic pattern onto the wafer. One of the known exposure apparatus having such a configuration is, for example, the exposure apparatus described in U.S. Pat. No. 6,738,129.

An object of the present invention is to provide an optical integrator with characteristics to suppress the influence of relative positioning error of a plurality of optical members on the illuminance distribution and on the shape of the illumination field.

Another object of the present invention is to provide an illumination optical apparatus with high performance capable of illuminating a surface to be illuminated, under a desired illumination condition, using an optical integrator with less influence of relative positioning error of a plurality of optical members on the illuminance distribution and on the shape of the illumination field.

Still another object of the present invention is to provide an exposure apparatus and exposure method capable of performing good projection exposure under a good illumination condition, using an illumination optical apparatus with high performance adapted to illuminate a surface to be illuminated, under a desired illumination condition.

SUMMARY

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A first embodiment of the present invention provides an optical integrator of a wavefront splitting type comprising a first optical member and a second optical member in an order mentioned from an entrance side of light, wherein the first optical member comprises a plurality of first entrance surfaces having a predetermined refractive power in a first direction in a plane perpendicular to the optical axis and substantially no refractive power in a second direction perpendicular to the first direction in the plane perpendicular to the optical axis, and a plurality of first exit surfaces formed so as to correspond to the plurality of first entrance surfaces and having a predetermined refractive power in the first direction and substantially no refractive power in the second direction, and wherein the second optical member comprises a plurality of second entrance surfaces formed so as to correspond to the plurality of first entrance surfaces and having a predetermined refractive power in the second direction and substantially no refractive power in the first direction, and a plurality of second exit surfaces formed so as to correspond to the plurality of first entrance surfaces and having a predetermined refractive power in the second direction and substantially no refractive power in the first direction.

A second embodiment of the present invention provides an optical integrator of a wavefront splitting type comprising a first optical element, and a second optical element disposed behind the first optical element, wherein the first optical element comprises an entrance surface having a predetermined refractive power in a first direction in a plane perpendicular to the optical axis and substantially no refractive power in a second direction perpendicular to the first direction in the plane perpendicular to the optical axis, and an exit surface having a predetermined refractive power in the first direction and substantially no refractive power in the second direction, wherein the second optical element comprises an entrance surface having a predetermined refractive power in the second direction and substantially no refractive power in the first direction, and an exit surface having a predetermined refractive power in the second direction and substantially no refractive power in the first direction, and wherein at least one of the first optical element and the second optical element comprises a plurality of optical elements.

A third embodiment of the present invention provides an illumination optical apparatus for illuminating a surface to be illuminated, based on light from a light source, the illumination optical apparatus comprising the optical integrator of the first aspect or the second aspect which is disposed in an optical path between the light source and the surface to be illuminated.

A fourth embodiment of the present invention provides an exposure apparatus comprising the illumination optical apparatus of the third embodiment, and a projection optical system for projecting a predetermined pattern provided in the surface to be illuminated, onto a photosensitive substrate to effect exposure thereof.

A fifth embodiment of the present invention provides an exposure method comprising illuminating a mask through the illumination optical apparatus of the third embodiment; and projecting a pattern of the illuminated mask onto a photosensitive substrate through a projection optical system to effect exposure thereof.

A sixth embodiment of the present invention provides a device manufacturing method as a method of manufacturing a device, using the exposure apparatus of the fourth embodiment, the method comprising:

an illumination step of illuminating an illumination region on the predetermined pattern, using the illumination optical apparatus;

a projection step of projecting an image of the predetermined pattern in the illumination region onto the photosensitive substrate, using the projection optical system; and a development step of developing the photosensitive substrate.

Brief Description of the Drawings

A general architecture that implements the various features of the invention will now be described with reference to the drawings. The drawings and the associated descriptions are provided to illustrate embodiments of the invention and not to limit the scope of the invention.

DESCRIPTION OF THE EMBODIMENTS

Figure 1:
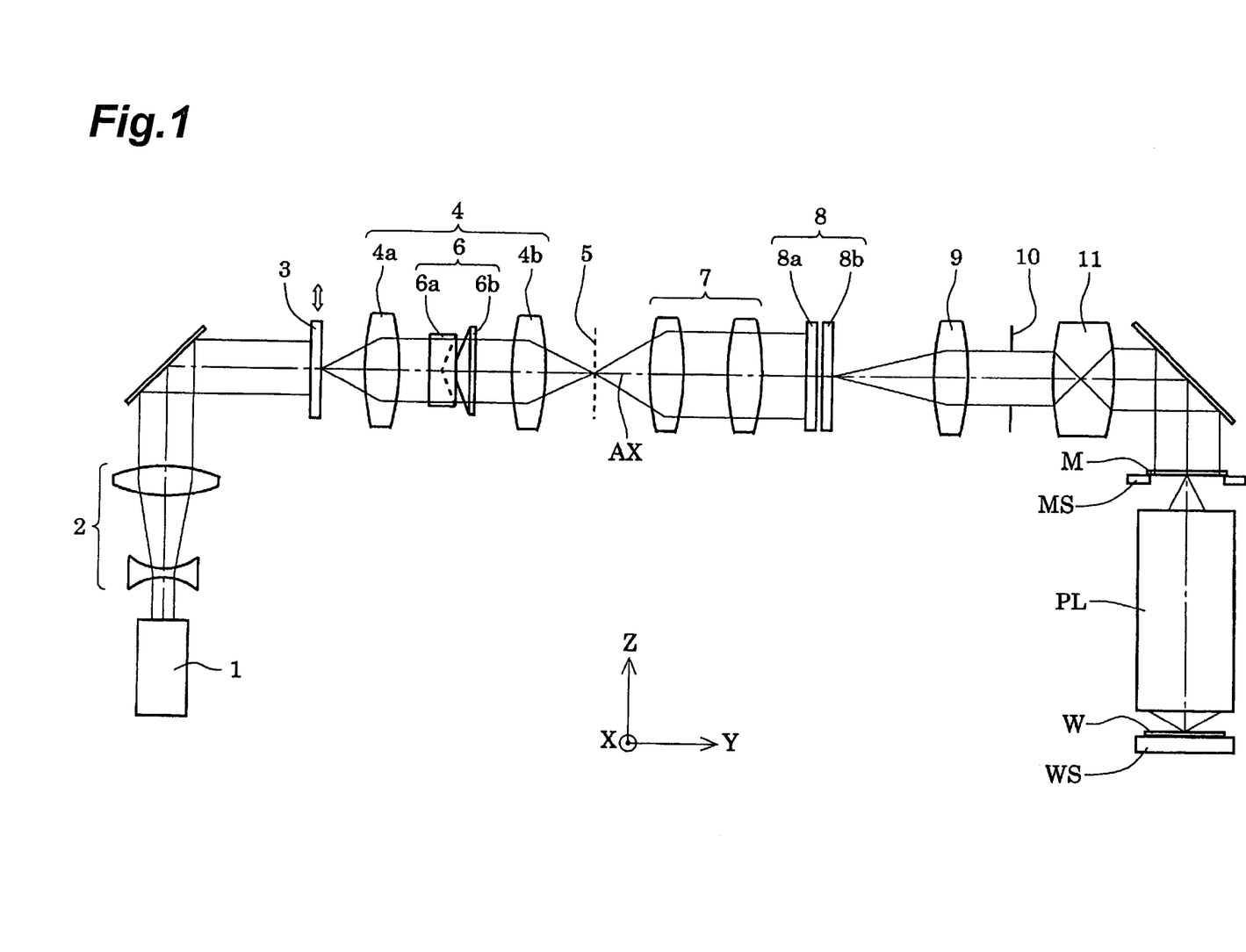
FIG. 1 is a drawing schematically showing a configuration of an exposure apparatus according to an embodiment of the present invention.

Embodiments of the present invention will be described on the basis of the accompanying drawings. FIG. 1 is a drawing schematically showing a configuration of an exposure apparatus according to an embodiment of the present invention. In FIG. 1, the Z-axis is set along a direction of a normal to a wafer W being a photosensitive substrate, the Y-axis along a direction parallel to the page of FIG. 1 in the surface of the wafer W, and the X-axis along a direction perpendicular to the page of FIG. 1 in the surface of the wafer W.

With reference to FIG. 1, the exposure apparatus of the present embodiment is provided with a light source 1 for supplying exposure light (illumination light). The light source 1 to be used can be, for example, an ArF excimer laser light source for supplying light of the wavelength of 193 nm, a KrF excimer laser light source for supplying light of the wavelength of 248 nm, or the like. A nearly parallel light beam emitted along the Z-direction from the light source 1 is expanded and shaped into a light beam of a predetermined rectangular cross section by a beam expander 2.

The nearly parallel light beam having passed through the beam expander 2 as a shaping optical system travels, for example, through a diffractive optical element 3 for annular illumination to enter an afocal lens 4. The afocal lens 4 is an afocal system (afocal optic) so set that the front focus position thereof is approximately coincident with the position of the diffractive optical element 3 and that the rear focus position thereof is approximately coincident with a position of a predetermined plane 5 indicated by a dashed line in the drawing.

In general, a diffractive optical element is made by forming steps with a pitch approximately equal to the wavelength of the exposure light (illumination light) in a substrate, and functions to diffract an incident light beam at desired angles. Specifically, the diffractive optical element 3 for annular illumination has the following function: when a parallel light beam of a rectangular cross section is incident to the diffractive optical element 3, it forms a light intensity distribution of an annular shape in its far field (or Fraunhofer diffraction region).

Therefore, the nearly parallel light beam incident to the diffractive optical element 3 as a light beam converting element forms an annular light intensity distribution on the pupil plane of the afocal lens 4 and thereafter emerges in an annular angular distribution from the afocal lens 4. A conical axicon system 6 is disposed in the optical path between a front lens unit 4a and a rear lens unit 4b of the afocal lens 4 and at or near the pupil plane thereof, and the detailed configuration and action thereof will be described later. For simplification of description, the basic configuration and action will be described below, while ignoring the action of the conical axicon system 6.

The light beam having passed through the afocal lens 4 is incident to a zoom lens 7 for variation of σ-value (σ-value=mask-side numerical aperture of the illumination optical apparatus/mask-side numerical aperture of the projection optical system). An entrance surface of a micro fly's eye lens 8 consisting of a first fly's eye member 8a and a second fly's eye member 8b in the order mentioned from the light source side (i.e., an entrance surface of the first fly's eye member 8a) is positioned near the rear focal plane of the zoom lens 7. The micro fly's eye lens 8 functions as a wavefront splitting type optical integrator that forms a substantial surface illuminant on the basis of an incident light beam, and the detailed configuration and action thereof will be described later.

A micro fly's eye lens is a component obtained by setting the size of microscopic lens elements constituting a fly's eye lens, to a very small dimension. The fly's eye lens consists of a large number of lens elements arranged vertically and horizontally, and densely, while the micro fly's eye lens consists of a large number of microscopic refracting surfaces integrally formed. Namely, the fly's eye lens is made by polishing each lens element singly and combining a lot of lens elements in a dense array, whereas the micro fly's eye lens is made, for example, by forming a large number of microscopic refracting surfaces in a plane-parallel plate by use of the MEMS technology (lithography+etching, or the like).

The predetermined plane 5 is located near the front focus position of the zoom lens 7 and the entrance surface of the micro fly's eye lens 8 is located near the rear focus position of the zoom lens 7. In other words, the zoom lens 7 functions to arrange the predetermined plane 5 and the entrance surface of the micro fly's eye lens 8 substantially in the relation of Fourier transform and, eventually, to arrange the pupil plane of the afocal lens 4 and the entrance surface of the micro fly's eye lens 8 substantially optically conjugate with each other.

Therefore, for example, an annular illumination field is formed around the optical axis AX on the entrance surface of the micro fly's eye lens 8, as on the pupil plane of the afocal lens 4. The overall shape of this annular illumination field varies similarly depending upon the focal length of the zoom lens 7. The light beam incident to the micro fly's eye lens 8 is two-dimensionally split thereby to form a secondary light source having much the same light intensity distribution as the illumination field formed by the incident light beam, i.e., a secondary light source consisting of a substantial surface illuminant of an annular shape centered on the optical axis AX, on or near the rear focal plane of the micro fly's eye lens 8 (and on the illumination pupil eventually).

The conical axicon system 6 is composed of a first prism member 6a a plane of which faces the light source side and a refracting surface of a concave conical shape of which faces the mask side, and a second prism member 6b a plane of which faces the mask side and a refracting surface of a convex conical shape of which faces the light source side, in order from the light source side. Then the refracting surface of the concave conical shape of the first prism member 6a and the refracting surface of the convex conical shape of the second prism member 6b are formed in such complementary shapes as to be able to butt each other. At least one of the first prism member 6a and the second prism member 6b is arranged to be movable along the optical axis AX to vary the distance between the refracting surface of the concave conical shape of the first prism member 6a and the refracting surface of the convex conical shape of the second prism member 6b. The following will describe the action of the conical axicon system 6 and the action of the zoom lens 7 with focus on the secondary light source of annular shape or quadrupole shape.

In a state in which the refracting surface of the concave conical shape of the first prism member 6a butts on the refracting surface of the convex conical shape of the second prism member 6b, the conical axicon system 6 functions as a plane-parallel plate and has no effect on the secondary light source of annular shape or quadrupole shape formed. However, when the refracting surface of the concave conical shape of the first prism member 6a is located apart from the refracting surface of the convex conical shape of the second prism member 6b, the outside diameter (inside diameter) of the annular or quadrupole secondary light source varies while the width of the annular or quadrupole secondary light source (half of a difference between an outside diameter and an inside diameter of the annular secondary light source; half of a difference between a diameter (outside diameter) of a circle circumscribed on the quadrupole secondary light source and a diameter (inside diameter) of a circle inscribed therein) is kept constant. Namely, an annular ratio (inside diameter/outside diameter) and the size (outside diameter) of the annular or quadrupole secondary light source are subjected to change.

The zoom lens 7 has a function of similarly enlarging or reducing the overall shape of the annular or quadrupole secondary light source. For example, when the focal length of the zoom lens 7 is increased from a minimum to a predetermined value, the overall shape of the annular or quadrupole secondary light source is similarly enlarged. In other words, the width and size (outside diameter) of the annular or quadrupole secondary light source vary without change in the annular ratio thereof, through the action of the zoom lens 7. In this manner, the annular ratio and size (outside diameter) of the annular or quadrupole secondary light source can be controlled by the action of the conical axicon system 7 and the zoom lens 7.

Light beams from the secondary light source formed on or near the rear focal plane of the micro fly's eye lens 8 travel through a condenser optical system 9 to illuminate a mask blind 10 located at a position approximately optically conjugate with a mask (and a wafer eventually), in a superposed manner. In this way, an illumination field of a rectangular shape is formed on the mask blind 10 as an illumination field stop. The light beams having passed through an aperture (optically transparent portion) of a rectangular shape in the mask blind 10 are subjected to condensing action of an imaging optical system 11 and then illuminate the mask M with a predetermined pattern therein in a superposed manner.

In this manner, the imaging optical system 11 comes to form an image of the rectangular aperture of the mask blind 10 on the mask M supported on a mask stage MS. A pattern to be transferred is formed in the mask M and the mask M is illuminated in a pattern region of a rectangular shape (slit shape) having longer sides along the X-direction and shorter sides along the Y-direction, in the entire pattern region. a light beam transmitted by the pattern of the mask M travels through a projection optical system PL to form a pattern image of the mask M on the wafer W being a photosensitive substrate.

Namely, the pattern image is also formed in a still exposure region (effective exposure region) of a rectangular shape having longer sides along the X-direction and shorter sides along the Y-direction, on the wafer W so as to optically correspond to the rectangular illumination region on the mask M. In this fashion, according to the so-called step-and-scan method, the mask stage MS and wafer stage WS, therefore, the mask M and the wafer W, are synchronously moved (scanned) along the Y-direction (scan direction) in the plane (XY plane) perpendicular to the optical axis AX of the projection optical system PL, whereby scanning exposure of the mask pattern is effected in a shot area (exposure region) having a width equal to the X-directional length of the still exposure region and a length according to a scanning distance (movement distance) of the wafer, on the wafer W.

Incidentally, in the case of the exposure apparatus of the step-and-scan method, even when there remains some illuminance unevenness in the scanning direction (scan direction: Y-direction) in the still exposure region of the rectangular shape long and thin along the X-direction on the wafer W, it will raise no significant problem by virtue of averaging effect of the scanning exposure. In other words, the illuminance unevenness to be suppressed in the still exposure region on the wafer W is that in the direction perpendicular to the scanning direction, i.e., in the orthogonal direction to scan (non-scan direction: X-direction).

Figure 2:
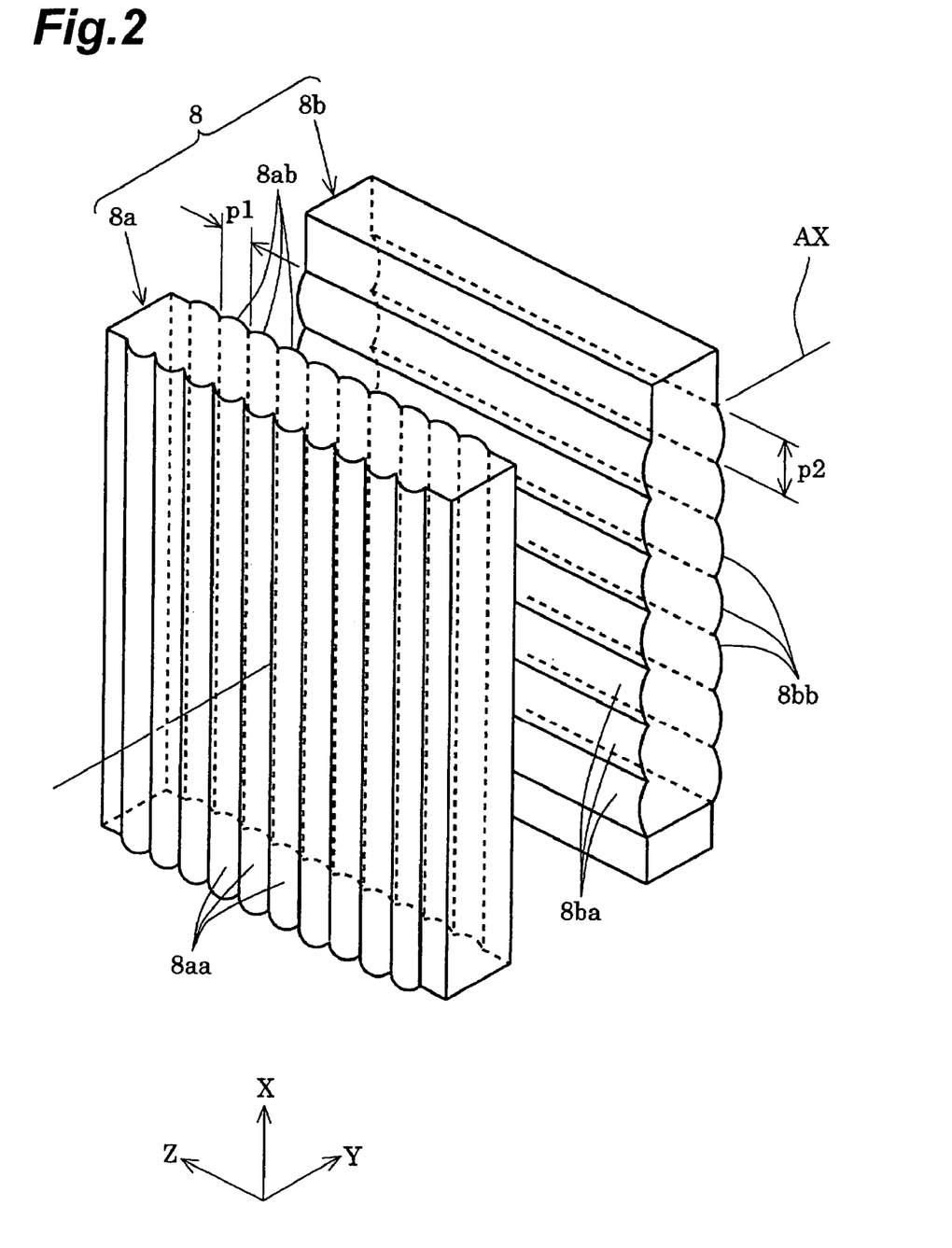
FIG. 2 is a perspective view schematically showing a configuration of a cylindrical micro fly's eye lens in the embodiment.

FIG. 2 is a perspective view schematically showing a configuration of the micro fly's eye lens in the present embodiment. Referring to FIG. 2, the micro fly's eye lens (cylindrical micro fly's eye lens) 8 is composed of a first fly's eye member (first optical member) 8a disposed on the light source side and a second fly's eye lens (second optical member) 8b disposed on the mask side (surface-to-be-illuminated side). Cylindrical lens surface groups 8aa and 8ab arranged at a predetermined pitch along the Z-direction are formed each at a pitch p1 in a source-side surface and a mask-side surface of the first fly's eye member 8a.

On the other hand, cylindrical lens surface groups 8ba and 8bb arranged at a predetermined pitch along the X-direction are formed each at a pitch p2 (p2>p1) in a source-side surface and a mask-side surface of the second fly's eye member 8b. Focusing our attention on the refraction in the Z-direction of the cylindrical micro fly's eye lens 8 (i.e., refraction in the YZ plane), a parallel light beam incident along the optical axis AX undergoes wavefront splitting at the pitch p1 along the Z-direction by the cylindrical lens surface group 8aa formed on the light source side of the first fly's eye member 8a, and each split light beam is subjected to condensing action of a refracting surface thereof, and thereafter is subjected to condensing action of a corresponding refracting surface in the cylindrical lens surface group 8ab formed on the mask side of the first fly's eye member 8a, to be condensed behind the cylindrical micro fly's eye lens 8.

On the other hand, focusing our attention on the refraction in the X-direction of the cylindrical micro fly's eye lens 8 (i.e., refraction in the XY plane), a parallel light beam incident along the optical axis AX undergoes wavefront splitting at the pitch p2 along the X-direction by the cylindrical lens surface group 8ba formed on the light source side of the second fly's eye member 8b, and each split light beam is subjected to condensing action of a refracting surface thereof, and thereafter is subjected to condensing action of a corresponding refracting surface in the cylindrical lens surface group 8bb formed on the mask side of the second fly's eye member 8b, to be condensed behind the cylindrical micro fly's eye lens 8.

Figure 3:
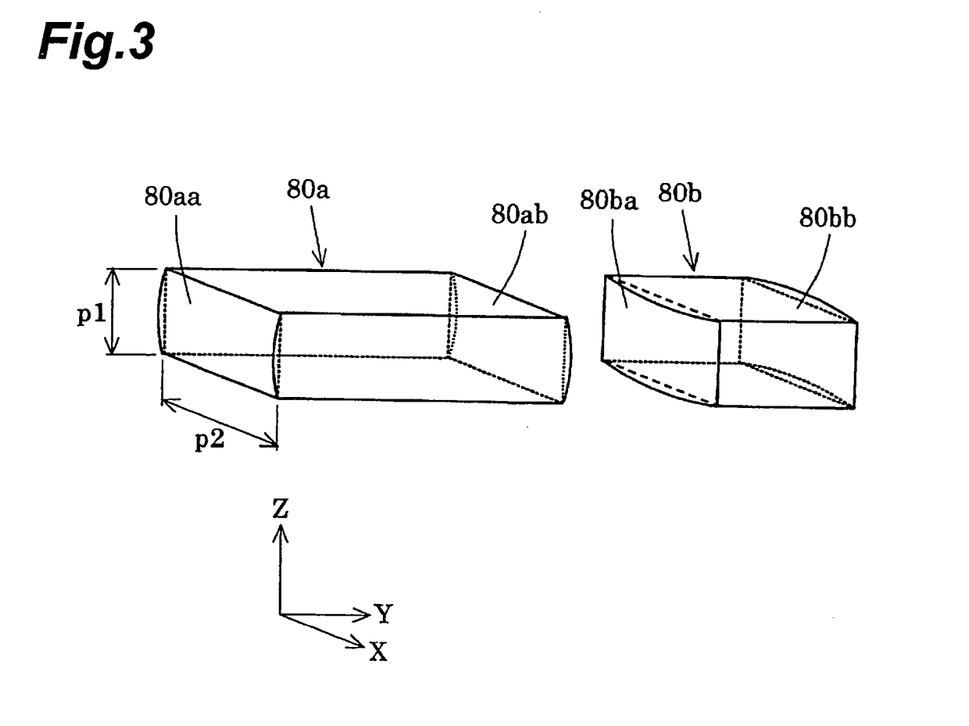
FIG. 3 is a perspective view schematically showing a set of a pair of optical elements corresponding to each unit region of wavefront splitting in the cylindrical micro fly's eye lens in the embodiment.

As described above, the cylindrical micro fly's eye lens 8 of the present embodiment is composed of the first fly's eye member 8a and the second fly's eye member 8b in each of which the cylindrical lens surface groups are arranged on both sides (on the light entrance side (light source side) and on the light exit side (mask side)). On the other hand, focusing attention on each unit region of wavefront splitting, the cylindrical micro fly's eye lens 8 is optically equivalent to a configuration wherein sets of first optical elements 80a and second optical elements 80b each having a rectangular cross section with shorter sides of p1 and longer sides of p2 are arranged vertically and horizontally, and densely, as shown in FIG. 3.

A first optical element 80a has a first entrance surface 80aa having a predetermined refractive power in the Z-direction (first direction) in the XZ plane perpendicular to the optical axis AX and no refractive power in the X-direction (second direction) in the XZ plane, and a first exit surface 80ab formed so as to correspond to the first entrance surface 80aa and having a predetermined refractive power in the Z-direction and no refractive power in the X-direction. A second optical element 80b has a second entrance surface 80ba formed so as to correspond to the first entrance surface 80aa of the first optical element 80a and having a predetermined refractive power in the X-direction and no refractive power in the Z-direction, and a second exit surface 80bb formed so as to correspond to the first entrance surface 80aa of the first optical element 80a and having a predetermined refractive power in the X-direction and no refractive power in the Z-direction.

Namely, the dense arrangement along the XZ plane of the plurality of first entrance surfaces 80aa corresponds to the cylindrical lens surface group 8aa on the light source side of the first fly's eye member 8a, and the dense arrangement along the XZ plane of the plurality of first exit surfaces 80ab corresponds to the cylindrical lens surface group 8ab on the mask side of the first fly's eye member 8a. Furthermore, the dense arrangement along the XZ plane of the plurality of second entrance surfaces 80ba corresponds to the cylindrical lens surface group 8ba on the light source side of the second fly's eye member 8b, and the dense arrangement along the XZ plane of the plurality of second exit surfaces 80bb corresponds to the cylindrical lens surface group 8bb on the mask side of the second fly's eye member 8b.

Figure 4:
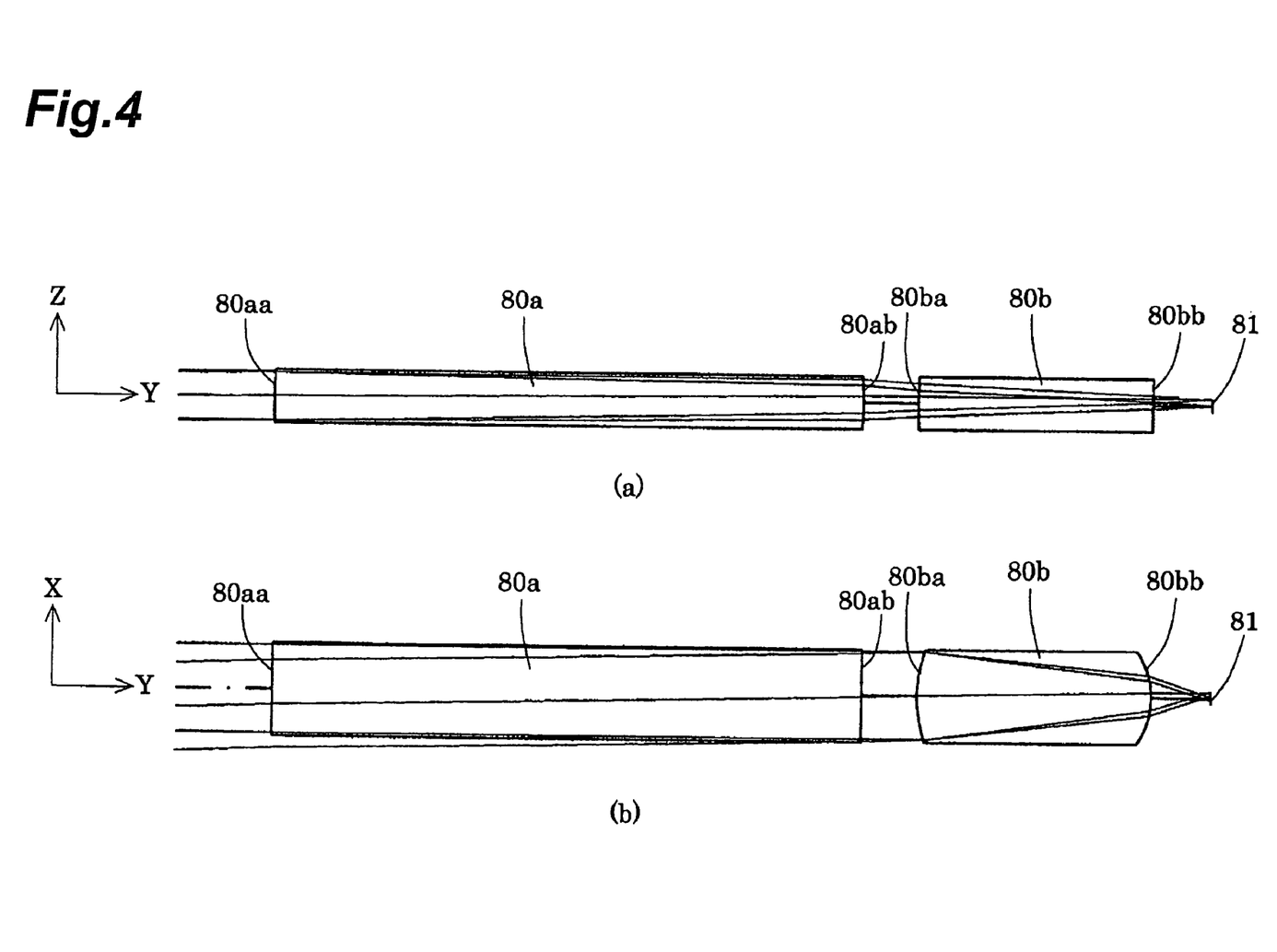
FIG. 4 is a drawing schematically showing refraction in the pair of optical elements shown in FIG. 3.

In this case, focusing attention on the refraction in the YZ plane, as shown in FIG. 4 (a), rays incident in parallel with the optical axis of the first optical element 80a (which is coincident with the optical axis of the second optical element 80b) are condensed by the first entrance surface 80aa and the first exit surface 80ab of the first optical element 80a to be condensed on the optical axis of the first optical element 80a on a predetermined plane 81 behind the second optical element 80b. Furthermore, rays obliquely incident at a predetermined angle to the optical axis of the first optical element 80a are also condensed similarly by the first entrance surface 80aa and the first exit surface 80ab of the first optical element 80a to be condensed at a position apart along the Z-direction from the optical axis of the first optical element 80a on the predetermined plane 81. At this time, a center ray in the obliquely incident ray group emerges in parallel with the optical axis of the first optical element 80a from the second optical element 80b.

These rays once condensed on the predetermined plane 81 by the condensing action of the first entrance surface 80aa and the first exit surface 80ab of the first optical element 80a are distributed along the shorter-side direction of the rectangular still exposure region on the wafer W. Namely, a surface shape error of the first entrance surface 80aa of the first optical element 80a (consequently, a surface shape error of the cylindrical lens surface group 8aa on the light source side of the first fly's eye member 8a), and a surface shape error of the first exit surface 80ab (consequently, a surface shape error of the cylindrical lens surface group 8ab on the mask side of the first fly's eye member 8a) affect the illuminance unevenness in the shorter-side direction or scanning direction in the rectangular still exposure region. However, the surface shape error of the first exit surface 80ab affects the illuminance unevenness in the scanning direction more than that of the first entrance surface 80aa approximately optically conjugate with the wafer W.

On the other hand, focusing attention on the refraction in the XY plane, as shown in FIG. 4 (b), rays incident in parallel with the optical axis of the first optical element 80a are condensed by the second entrance surface 80ba and the second exit surface 80bb of the second optical element 80b to be condensed on the optical axis of the first optical element 80a on a predetermined plane (which is not depicted; and which is, for example, the predetermined plane 81 or a plane near it) behind the second optical element 80b. Furthermore, rays obliquely incident at a predetermined angle to the optical axis of the first optical element 80a are also condensed similarly by the second entrance surface 80ba and the second exit surface 80bb of the second optical element 80b to be condensed at a position apart along the X-direction from the optical axis of the first optical element 80a on the predetermined plane. At this time, a center ray in the obliquely incident ray group emerges in parallel with the optical axis of the first optical element 80a from the second optical element 80b.

These rays once condensed on the predetermined plane by the condensing action of the second entrance surface 80ba and the second exit surface 80bb of the second optical element 80b are distributed along the longer-side direction of the rectangular still exposure region on the wafer W. Namely, a surface shape error of the second entrance surface 80ba of the second optical element 80b (consequently, a surface shape error of the cylindrical lens surface group 8ba on the light source side of the second fly's eye member 8b), and a surface shape error of the second exit surface 80bb (consequently, a surface shape error of the cylindrical lens surface group 8bb on the mask side of the second fly's eye member 8b) affect the illuminance unevenness in the longer-side direction or orthogonal direction in the rectangular still exposure region. However, the surface shape error of the second exit surface 80bb affects the illuminance unevenness in the orthogonal direction more than that of the second entrance surface 80ba approximately optically conjugate with the wafer W.

In the cylindrical micro fly's eye lens 8 of the present embodiment, as described above, the rear focus position in the Z-direction and the rear focus position in the X-direction of the composite system of the first optical element 80a and the second optical element 80b are located behind the second optical element 80b. This is because a laser beam, when condensed in an optical element, will locally increase an energy density therein and it will result in raising a risk of degradation of durability of the optical element. For this reason, it is necessary to secure a considerably long back focus in the Z-direction for the composite system of the first optical element 80a and the second optical element 80b, but a design solution can be obtained by setting the pitch ratio and the power (refractive power) ratio of the first entrance surface 80aa and the first exit surface 80ab in appropriate ranges.

Figure 5:
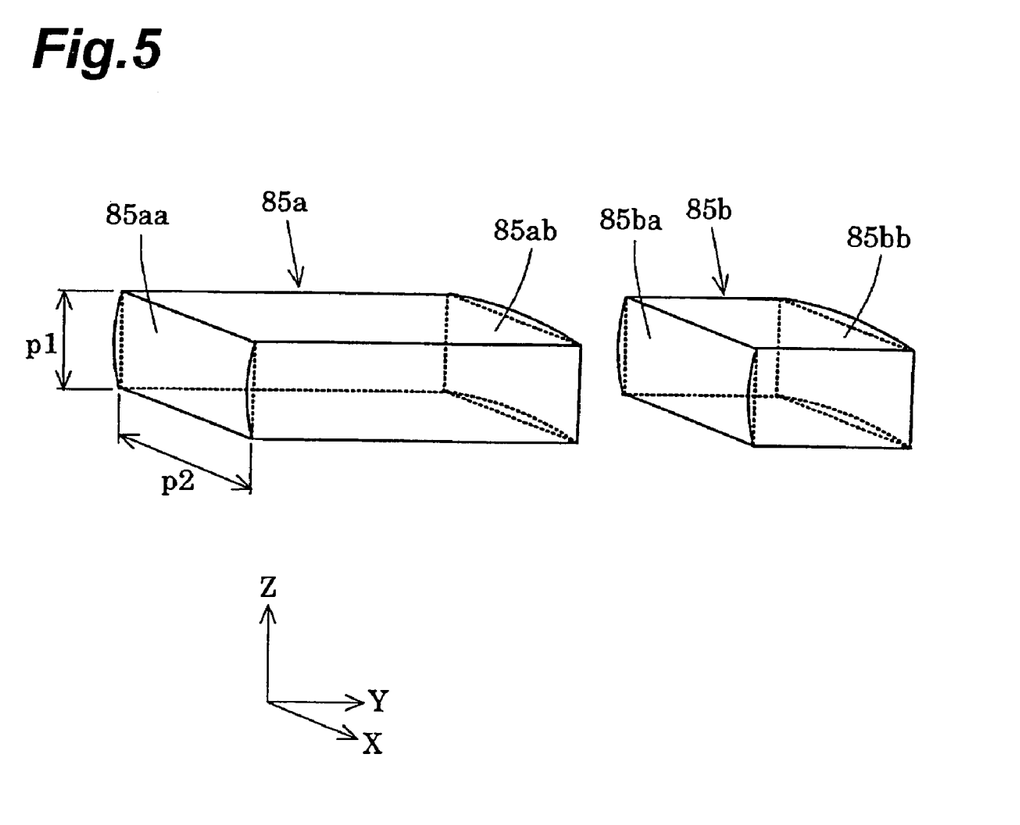
FIG. 5 is a perspective view schematically showing a set of a pair of optical elements corresponding to each unit region of wavefront splitting in a cylindrical micro fly's eye lens as a comparative example so as to correspond to FIG. 3.

For explaining the advantage of the cylindrical micro fly's eye lens of the present embodiment, let us discuss the disadvantage of the cylindrical micro fly's eye lens as a comparative example. FIG. 5 is a drawing schematically showing a set of a pair of optical elements corresponding to each unit region of wavefront splitting in the cylindrical micro fly's eye lens of the comparative example so as to correspond to FIG. 3. Referring to FIG. 5, in the cylindrical micro fly's eye lens of the comparative example a first optical element 85a has a first entrance surface 85aa having a predetermined refractive power in the Z-direction and no refractive power in the X-direction, and a first exit surface 85ab having a predetermined refractive power in the X-direction and no refractive power in the Z-direction.

A second optical element 85b has a second entrance surface 85ba having a predetermined refractive power in the Z-direction and no refractive power in the X-direction, and a second exit surface 85bb having a predetermined refractive power in the X-direction and no refractive power in the Z-direction. In the cylindrical micro fly's eye lens of the comparative example, therefore, a surface shape error of the first exit surface 85ab and a surface shape error of the second exit surface 85bb affect the illuminance unevenness in the orthogonal direction, and the surface shape error of the second exit surface 85bb affects it more than that of the first exit surface 85ab approximately optically conjugate with the wafer W.

In the comparative example, occurrence of the illuminance unevenness in the orthogonal direction due to the surface shape error can be suppressed to some extent by imposing a larger power (refractive power) on the first exit surface 85ab, the surface shape error of which is less likely to affect the illuminance unevenness in the orthogonal direction, than that on the second exit surface 85bb, the surface shape error of which is likely to affect the illuminance unevenness in the orthogonal direction. However, it is difficult for this power allocation in the configuration of the comparative example to adequately avoid the occurrence of the illuminance unevenness in the orthogonal direction due to the surface shape error.

In the cylindrical micro fly's eye lens of the comparative example, two refracting surfaces with the refractive power in the Z-direction (first entrance surface 85aa and second entrance surface 85ba) are provided in the first optical element 85a and in the second optical element 85b, respectively, and two refracting surfaces with the refractive power in the X-direction (first exit surface 85ab and second exit surface 85bb) are provided in the first optical element 85a and in the second optical element 85b, respectively. As a result, when there occurs relative positional deviation along the Y-direction, relative positional deviation along the Z-direction, or relative positional deviation along the X-direction between the first optical element 85a and the second optical element 85b, i.e., when there occurs a relative positioning error between the pair of optical members (fly's eye members), illumination unevenness will readily occur on the wafer W due to these relative positioning errors (error of the distance along the optical-axis direction, shift error along the direction perpendicular to the optical axis, etc.) and in certain cases, the shape of the illumination field might also change on the mask M.

In contrast to it, in the cylindrical micro fly's eye lens 8 of the present embodiment, two refracting surfaces with the refractive power in the Z-direction (the first entrance surface 80aa and the first exit surface 80ab) are provided in the first optical element 85a only, and two refracting surfaces with the refractive power in the X-direction (the second entrance surface 80ba and the second exit surface 80bb) are provided in the second optical element 85b only. Therefore, even when there occurs relative positional deviation along the Y-direction between the first optical element 85a and the second optical element 85b, i.e., even when there occurs an error of the distance along the optical-axis direction between a pair of fly's eye members 8a and 8b, this distance error will easily cause neither illumination unevenness nor change in the shape of the illumination field.

In the cylindrical micro fly's eye lens of the present embodiment, as described above, influence of manufacturing error of the large number of refracting surfaces on the illuminance distribution can be kept small even in a case where all the microscopic refracting surfaces are required to be simultaneously manufactured by etching, by which it is harder to make a good surface shape than, for example, by polishing.

Furthermore, even when there occurs relative positional deviation along the Z-direction or relative positional deviation along the X-direction between the first optical element 85a and the second optical element 85b, i.e., even when there occurs a shift error along the orthogonal direction between a pair of fly's eye members 8a and 8b, there will occur little illumination unevenness due to this shift error and little change in the shape of the illumination field. In other words, the cylindrical micro fly's eye lens of the present embodiment has the characteristics to suppress the influence of relative positioning error between the pair of fly's eye members (optical members) 8a and 8b on the illuminance distribution on the wafer W and the shape of the illumination field on the mask M.

Furthermore, the illumination optical apparatus of the present embodiment is able to illuminate the mask M as a surface to be illuminated, under a desired illumination condition, using the cylindrical micro fly's eye lens (optical integrator) 8 with less influence of relative positioning error between the pair of fly's eye members 8a and 8b on the illuminance distribution and on the shape of the illumination field. The exposure apparatus of the present embodiment is able to perform good projection exposure under a good illumination condition, using the illumination optical apparatus with high performance for illuminating the mask M under the desired illumination condition.

Incidentally, as described above, the surface shape error of the second exit surface 80bb affects the illuminance unevenness in the orthogonal direction more than that of the second entrance surface 80ba approximately optically conjugate with the wafer W. Therefore, occurrence of the illuminance unevenness in the orthogonal direction due to the surface shape error can be well suppressed by imposing a larger power (refractive power) on the second entrance surface 80ba, the surface shape error of which is less likely to affect the illuminance unevenness in the orthogonal direction, than that of the second exit surface 80bb, the surface shape error of which is likely to affect the illuminance unevenness in the orthogonal direction.

In the aforementioned embodiment, the cylindrical micro fly's eye lens 8 is composed of the first fly's eye member 8a and the second fly's eye member 8b in which the cylindrical lens surface groups are arranged on both sides. However, without having to be limited to this, the cylindrical micro fly's eye lens with the optical function similar to that in the present embodiment can also be constructed, for example, by arranging the first optical elements 80a and the second optical elements 80b as individual optical elements as shown in FIG. 3, vertically and horizontally, and densely.

In the exposure apparatus of the aforementioned embodiment, when a diffractive optical element for quadrupole illumination (not shown) is set in the illumination optical path, instead of the diffractive optical element 3 for annular illumination, it can effect quadrupole illumination. The diffractive optical element for quadrupole illumination has the following function: when a parallel light beam having a rectangular cross section is incident thereto, it forms a light intensity distribution of quadrupole shape in its far field. Therefore, light beams having passed through the diffractive optical element for quadrupole illumination form an illumination field of quadrupole shape consisting of four circular illumination fields around the optical axis AX, for example, on the entrance surface of the micro fly's eye lens 8. As a result, the secondary light source of the same quadrupole shape as the illumination field formed on the entrance surface is also formed on or near the rear focal plane of the micro fly's eye lens 8.

When a diffractive optical element for circular illumination (not shown) is set in the illumination optical path, instead of the diffractive optical element 3 for annular illumination, it can effect normal circular illumination. The diffractive optical element for circular illumination has the following function: when a parallel light beam having a rectangular cross section is incident thereto, it forms a light intensity distribution of circular shape in its far field. Therefore, a light beam having passed through the diffractive optical element for circular illumination forms an illumination field of a circular shape centered on the optical axis AX, for example, on the entrance surface of the micro fly's eye lens 8. As a result, the secondary light source of the same circular shape as the illumination field formed on the entrance surface is also formed on or near the rear focal plane of the micro fly's eye lens 8.

Furthermore, when another diffractive optical element for multi-pole illumination (not shown) is set in the illumination optical path, instead of the diffractive optical element 3 for annular illumination, it is feasible to implement one of various multi-pole illuminations (dipole illumination, octupole illumination, etc.). Similarly, when a diffractive optical element with an appropriate characteristic (not shown) is set in the illumination optical path, instead of the diffractive optical element 3 for annular illumination, it becomes feasible to implement one of off-axis or modified illuminations of various forms.

The exposure apparatus of the foregoing embodiment can be used to manufacture micro devices (semiconductor devices, image pickup devices, liquid-crystal display devices, thin-film magnetic heads, etc.) by illuminating a mask (reticle) by the illumination optical apparatus (illumination block) and projecting a pattern to be transferred, formed in the mask, onto a photosensitive substrate with the projection optical system (exposure block). An example of a technique of forming a predetermined circuit pattern in a wafer or the like as a photosensitive substrate with the exposure apparatus of the foregoing embodiment to obtain semiconductor devices as micro devices will be described below with reference to the flowchart of FIG. 6.

Figure 6:
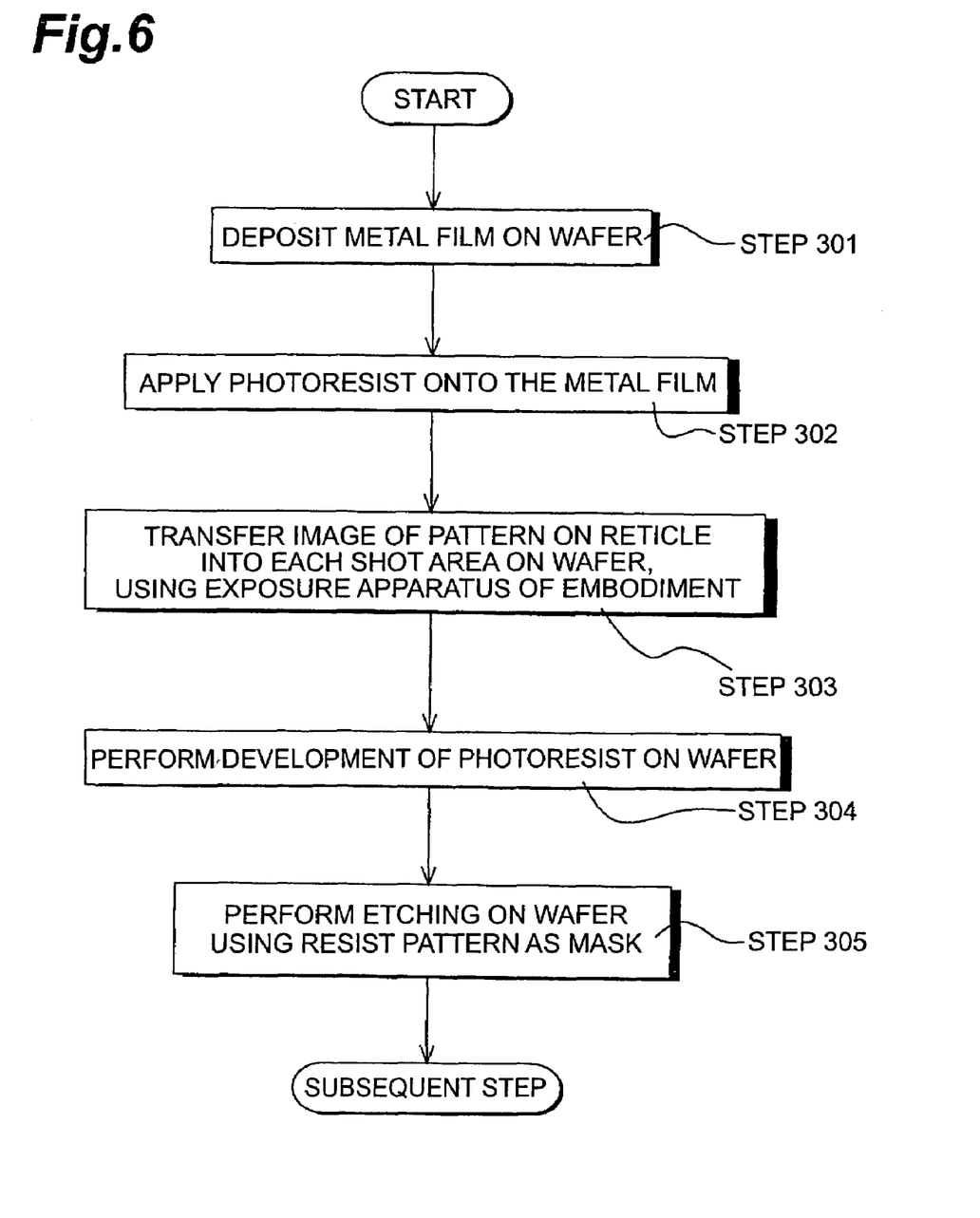
FIG. 6 is a flowchart of a technique of manufacturing semiconductor devices as micro devices.

The first block 301 in FIG. 6 is to deposit a metal film on each wafer in one lot. The next block 302 is to apply a photoresist onto the metal film on each wafer in the lot. The subsequent block 303 is to sequentially transfer an image of a pattern on the mask into each shot area on each wafer in the lot through the projection optical system, using the exposure apparatus of the foregoing embodiment. The subsequent block 304 is to perform development of the photoresist on each wafer in the lot and the subsequent block 305 is to perform etching on each wafer in the lot, using the resist pattern as a mask, and thereby to form a circuit pattern corresponding to the pattern on the mask, in each shot area on each wafer. Subsequent blocks include formation of circuit patterns in upper layers, and others, thereby manufacturing devices such as semiconductor devices. The above-described semiconductor device manufacturing method permits us to obtain semiconductor devices with extremely fine circuit patterns at high throughput.

Figure 7:
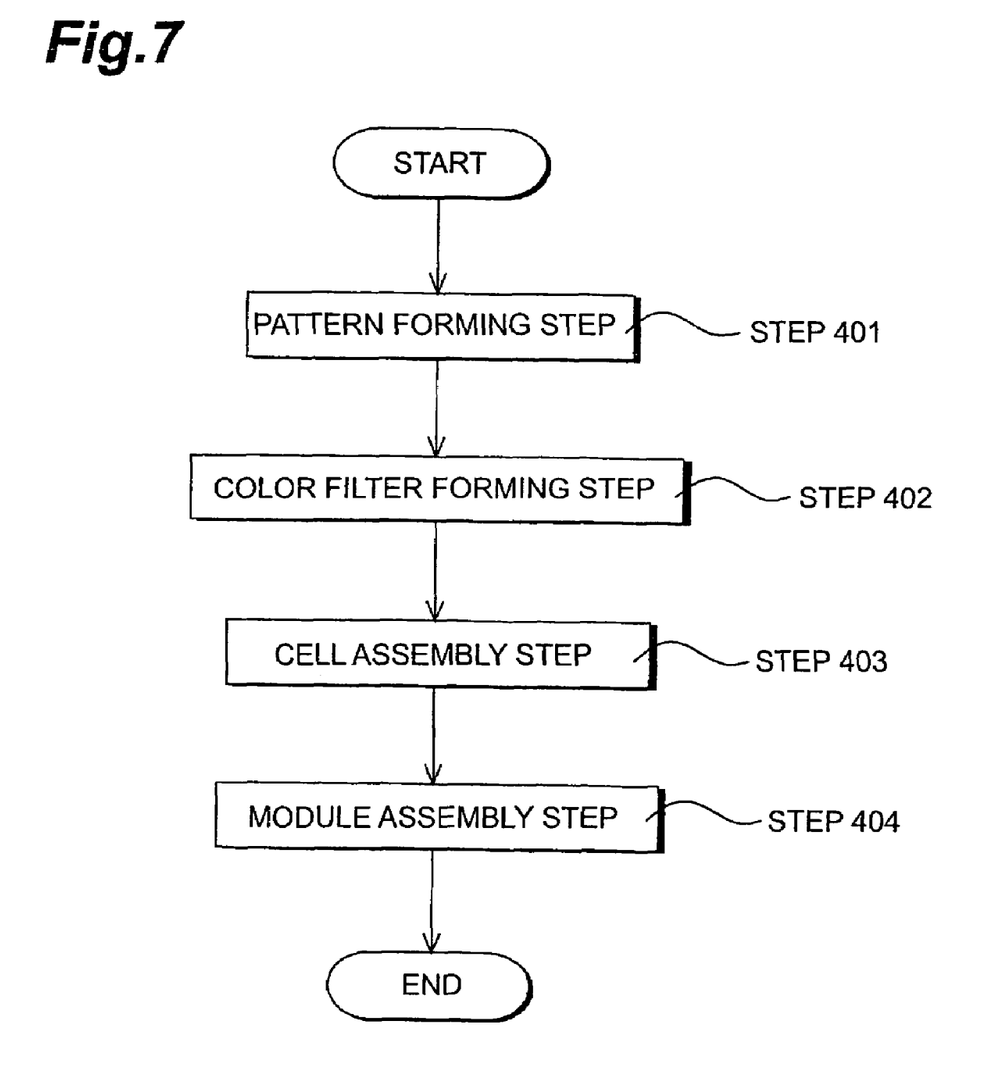
FIG. 7 is a flowchart of a technique of manufacturing a liquid-crystal display device as a micro device.

The exposure apparatus of the foregoing embodiment can also be used to manufacture a liquid-crystal display device as a micro device by forming predetermined patterns (circuit pattern, electrode pattern, etc.) on plates (glass substrates). An example of a technique in this case will be described with reference to the flowchart of FIG. 7. In FIG. 7, a pattern forming block 401 is to execute a so-called photolithography block to transfer a pattern of a mask onto a photosensitive substrate (glass substrate coated with a resist, or the like) with the exposure apparatus of the foregoing embodiment. This photolithography block results in forming the predetermined pattern including a number of electrodes and others on the photosensitive substrate. Thereafter, the exposed substrate is subjected to each of blocks such as development, etching, and resist removal, whereby a predetermined pattern is formed on the substrate. Thereafter, the process shifts to the next color filter forming block 402.

The next color filter forming block 402 is to form a color filter in which a number of sets of three dots corresponding to R (Red), G (Green), and B (Blue) are arrayed in a matrix pattern, or in which sets of three stripe filters of R, G, and B are arrayed as a plurality of lines along the horizontal scan line direction. After completion of the color filter forming block 402, a cell assembling block 403 is carried out. The cell assembling block 403 is to assemble a liquid crystal panel (liquid crystal cell), using the substrate with the predetermined pattern obtained in the pattern forming block 401, the color filter obtained in the color filter forming block 402, and so on.

In the cell assembling block 403, for example, a liquid crystal is poured into between the substrate with the predetermined pattern obtained in the pattern forming block 401 and the color filter obtained in the color filter forming block 402, to manufacture a liquid crystal panel (liquid crystal cell). The subsequent module assembling block 404 is to install each of components such as an electric circuit, a backlight, etc. for display operation of the assembled liquid crystal panel (liquid crystal cell) to complete the liquid-crystal display device. The above-described method of manufacturing the liquid-crystal display device permits us to obtain the liquid-crystal display device with an extremely fine circuit pattern at high throughput.

In the foregoing embodiment, the exposure light was the ArF excimer laser light (wavelength: 193 nm) or the KrF excimer laser light (wavelength: 248 nm), but, without having to be limited to these, the present invention is also applicable to other appropriate laser light sources, e.g., an $F_2$ laser light source for supplying a laser beam of the wavelength of 157 nm.

In the aforementioned embodiment, while the mask and the wafer are moved relative to the projection optical system, the scanning exposure of the pattern is effected in each exposure region on the wafer in accordance with the so-called step-and-scan method. However, without having to be limited to it, it is also possible to perform sequential exposure of the pattern in the shot areas on the wafer in accordance with the so-called step-and-repeat method of effecting one-shot or full-field exposure while two-dimensionally driving and controlling the wafer.

In the aforementioned embodiment, the image of the pattern formed in the mask is formed on the wafer by means of the projection optical system, but it is also possible to use a programmable pattern generator for forming a predetermined pattern, e.g., a spatial light modulator (SLM), instead of the mask. The optical integrator according to the present invention is applicable as the optical integrator in the illumination optical apparatus for polarized illumination, for example, as described in International Publication WO2004/051717A and the corresponding U.S. Patent Publication No. 2006/0055834A. The teachings of the U.S. Patent Publication No. 2006/0055834A are hereby incorporated by reference.

In the aforementioned embodiment, the present invention was described using the example of the exposure apparatus with the illumination optical apparatus, and it is apparent that the present invention is applicable to general illumination optical apparatus for illuminating a surface to be illuminated, except for the mask, e.g., laser processing apparatus for projecting a laser beam for processing onto a workpiece as a surface to be illuminated, laser annealing apparatus for forming a linear focused region on a workpiece as a surface to be illuminated, and so on. In the case where the linear focused region is formed on the surface to be illuminated, one of the first entrance surfaces and the first exit surfaces of the first optical member, or one of the second entrance surfaces and the second exit surfaces of the second optical member may be arranged as a single surface.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

The invention claimed is:

1. An optical integrator of a wavefront splitting type comprising:
    a first optical member including a plurality of first entrance surfaces having a predetermined refractive power in a first direction in a plane perpendicular to the optical axis and substantially no refractive power in a second direction perpendicular to the first direction in the plane perpendicular to the optical axis, and a plurality of first exit surfaces formed so as to correspond to the plurality of first entrance surfaces and having a predetermined refractive power in the first direction and substantially no refractive power in the second direction; and
    a second optical member arranged on an exit side of the first optical member, the second optical member including a plurality of second entrance surfaces formed so as to correspond to the plurality of first entrance surfaces and having a predetermined refractive power in the second direction and substantially no refractive power in the first direction, and a plurality of second exit surfaces formed so as to correspond to the plurality of first entrance surfaces and having a predetermined refractive power in the second direction and substantially no refractive power in the first direction,
    wherein the predetermined refractive power of the second entrance surfaces is greater than the predetermined refractive power of the second exit surfaces.

2. An optical integrator according to claim 1, wherein each of the plurality of first entrance surfaces includes a rectangular shape with shorter sides along the first direction and longer sides along the second direction.

3. An optical integrator according to claim 2, wherein the plurality of first entrance surfaces are densely arranged along the plane perpendicular to the optical axis.

4. An optical integrator according to claim 2, wherein the plurality of first entrance surfaces are arranged in parallel along the first direction.

5. An optical integrator according to claim 2, wherein the plurality of second entrance surfaces are arranged in parallel along the second direction.

6. An optical integrator according to claim 2, wherein each of the plurality of second entrance surfaces includes a rectangular shape with longer sides along the first direction and shorter sides along the second direction.

7. An optical integrator according to claim 1, wherein a composite system of the first optical member and the second optical member includes a rear focus position in the first direction and a rear focus position in the second direction which are located behind the second optical member.

8. An optical integrator according to claim 1, wherein optical surfaces having a refractive power in the first direction are only the first entrance surfaces and the first exit surfaces in the optical integrator, and
    optical surfaces having a refractive power in the second direction are only the second entrance surfaces and the second exit surfaces in the optical integrator.

9. An illumination optical apparatus for illuminating a surface to be illuminated, comprising the optical integrator as defined in claim 1, which is disposed in an optical path of the illumination optical apparatus.

10. An illumination optical apparatus according to claim 9, comprising a light-guide optical system disposed in an optical path between the optical integrator and the surface to be illuminated, and adapted for guiding light from the optical integrator to the surface to be illuminated, in a superposed manner.

11. An illumination optical apparatus according to claim 9, the illumination optical apparatus forming an illumination region of a rectangular shape on the surface to be illuminated,
    wherein a shorter-side direction of the illumination region of the rectangular shape corresponds to the first direction, and a longer-side direction of the illumination region of the rectangular shape corresponds to the second direction.

12. An exposure apparatus comprising the illumination optical apparatus as defined in claim 9, and a projection optical system for projecting a predetermined pattern provided in the surface to be illuminated, onto a photosensitive substrate to effect exposure thereof.

13. An exposure apparatus according to claim 12, wherein the illumination optical apparatus forms an illumination region of a rectangular shape on the predetermined pattern, and
a shorter-side direction of the illumination region of the rectangular shape corresponds to the first direction, and a longer-side direction of the illumination region of the rectangular shape corresponds to the second direction.

14. An exposure apparatus according to claim 13, wherein the projection optical system forms an image of the predetermined pattern located in the illumination region of the rectangular shape, in a projection region of a rectangular shape on the photosensitive substrate, and
the predetermined pattern is projected onto the photosensitive substrate to effect exposure thereof, with relative movement of the photosensitive substrate relative to the projection optical system along a shorter-side direction of the projection region of the rectangular shape.

15. A method of manufacturing a device, using the exposure apparatus as defined in claim 13,
the method comprising:
illuminating an illumination region on the predetermined pattern, using the illumination optical apparatus;
projecting an image of the predetermined pattern in the illumination region onto the photosensitive substrate, using the projection optical system; and
developing the photosensitive substrate.

16. An exposure method comprising illuminating a pattern through the illumination optical apparatus as defined in claim 9; and projecting the illuminated pattern onto a photosensitive substrate through a projection optical system to effect exposure thereof.

17. An exposure method according to claim 16, comprising forming an illumination region of a rectangular shape with shorter sides along a direction corresponding to the first direction and longer sides along a direction corresponding to the second direction, on the surface to be illuminated.

18. An exposure method according to claim 17, wherein the pattern is projected onto the photosensitive substrate to effect exposure thereof, with relative movement of the pattern and the photosensitive substrate relative to the projection optical system along the shorter-side direction of the illumination region of the rectangular shape.

19. An optical integrator of a wavefront splitting type comprising:
a plurality of first optical elements each of the first optical elements of the plurality of first optical elements including an entrance surface having a predetermined refractive power in a first direction in a plane perpendicular to the optical axis and substantially no refractive power in a second direction perpendicular to the first direction in the plane perpendicular to the optical axis, and an exit surface having a predetermined refractive power in the first direction and substantially no refractive power in the second direction; and
a plurality of second optical elements disposed on the exit side of the plurality of first optical elements, each of the second optical elements of the plurality of second optical elements including an entrance surface having a predetermined refractive power in the second direction and substantially no refractive power in the first direction, and an exit surface having a predetermined refractive power in the second direction and substantially no refractive power in the first direction,
wherein, the predetermined refractive power of the entrance surface of the second optical elements is greater than the predetermined refractive power of the exit surface of the second optical elements.

20. An optical integrator according to claim 19, wherein the plurality of second optical elements are arranged behind the plurality of first optical elements so as to correspond to the plurality of first optical elements.

21. An optical integrator according to claim 20, wherein each of the plurality of first optical elements includes a cross section of a rectangular shape with shorter sides along the first direction and longer sides along the second direction.

22. An optical integrator according to claim 21, wherein entrance surfaces of the plurality of first optical elements are densely arranged along the plane perpendicular to the optical axis.

23. An optical integrator according to claim 20, wherein the plurality of first optical elements are arranged in parallel along the first direction.

24. An optical integrator according to claim 23, wherein the plurality of second optical elements are arranged in parallel along the second direction.

25. An optical integrator according to claim 24, wherein each of the plurality of second optical elements includes a rectangular shape with longer sides along the first direction and shorter sides along the second direction.

26. An optical integrator according to claim 25, wherein a composite system of the first optical element and the second optical element includes a rear focus position in the first direction and a rear focus position in the second direction which are located behind the exit surface of the second optical element.

27. An optical integrator according to claim 20, wherein an optical element having a refractive power in the first direction is only the first optical element in the optical integrator, and
an optical element having a refractive power in the second direction is only the second optical element in the optical integrator.

28. An optical integrator according to claim 20, wherein the entrance surface and the exit surface of the first optical element are integrally formed on the first optical element, and
the entrance surface and the exit surface of the second optical element are integrally formed on the second optical element.

29. An illumination optical apparatus for illuminating a surface to be illuminated, comprising the optical integrator as defined in claim 19, which is disposed in an optical path of the illumination optical apparatus.

30. An illumination optical apparatus according to claim 29, comprising a light-guide optical system disposed in an optical path between the optical integrator and the surface to be illuminated, and adapted for guiding light from the optical integrator to the surface to be illuminated, in a superposed manner.

31. An illumination optical apparatus according to claim 29, the illumination optical apparatus forming an illumination region of a rectangular shape on the surface to be illuminated,
wherein a shorter-side direction of the illumination region of the rectangular shape corresponds to the first direction, and a longer-side direction of the illumination region of the rectangular shape corresponds to the second direction.

32. An exposure apparatus comprising the illumination optical apparatus as defined in claim 29, and a projection optical system for projecting a predetermined pattern provided in the surface to be illuminated, onto a photosensitive substrate to effect exposure thereof.

33. An exposure apparatus according to claim 32, wherein the illumination optical apparatus forms an illumination region of a rectangular shape on the predetermined pattern, and
a shorter-side direction of the illumination region of the rectangular shape corresponds to the first direction, and a longer-side direction of the illumination region of the rectangular shape corresponds to the second direction.

34. An exposure apparatus according to claim 33, wherein the projection optical system forms an image of the predetermined pattern located in the illumination region of the rectangular shape, in a projection region of a rectangular shape on the photosensitive substrate, and the predetermined pattern is projected onto the photosensitive substrate to effect exposure thereof, with relative movement of the photosensitive substrate relative to the projection optical system along a shorter-side direction of the projection region of the rectangular shape.

35. A method of manufacturing a device, using the exposure apparatus as defined in claim 33, comprising:

illuminating an illumination region on the predetermined pattern, using the illumination optical apparatus;

projecting an image of the predetermined pattern in the illumination region onto the photosensitive substrate, using the projection optical system; and developing the photosensitive substrate.

36. An exposure method comprising illuminating a pattern through the illumination optical apparatus as defined in claim 29; and projecting the illuminated pattern onto a photosensitive substrate through a projection optical system to effect exposure thereof.

37. An exposure method according to claim 36, comprising forming an illumination region of a rectangular shape with shorter sides along a direction corresponding to the first direction and longer sides along a direction corresponding to the second direction, on the surface to be illuminated.

38. An exposure method according to claim 37, wherein the pattern is projected onto the photosensitive substrate to effect exposure thereof, with relative movement of the pattern and the photosensitive substrate relative to the projection optical system along the shorter-side direction of the illumination region of the rectangular shape.

* * * * *